United States Patent
Choi et al.

(10) Patent No.: US 8,409,934 B2
(45) Date of Patent: Apr. 2, 2013

(54) METHODS FOR FORMING MATERIALS USING MICRO-HEATERS AND ELECTRONIC DEVICES INCLUDING SUCH MATERIALS

(75) Inventors: Junhee Choi, Seongnam-si (KR); Andrei Zoulkarneev, Suwon-si (KR); SungSoo Park, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 123 days.

(21) Appl. No.: 12/149,939

(22) Filed: May 9, 2008

(65) Prior Publication Data

US 2009/0020760 A1   Jan. 22, 2009

(30) Foreign Application Priority Data

Jul. 16, 2007  (KR) .................. 10-2007-0071355

(51) Int. Cl.
*G01N 27/28* (2006.01)
(52) U.S. Cl. ............. 438/148; 257/E29.273; 438/714
(58) Field of Classification Search .............. 438/148, 438/714; 257/E29.273
See application file for complete search history.

(56) References Cited

U.S. PATENT DOCUMENTS

| | | | |
|---|---|---|---|
| 3,745,508 A | 7/1973 | Bruder et al. | |
| 4,374,312 A | 2/1983 | Damron | |
| 4,478,077 A | 10/1984 | Bohrer et al. | |
| 4,510,036 A | 4/1985 | Takeuchi et al. | |
| 4,651,564 A | 3/1987 | Johnson et al. | |
| 4,696,188 A | 9/1987 | Higashi | |
| 5,288,973 A | 2/1994 | Ota et al. | |
| 5,780,524 A | 7/1998 | Olsen | |
| 6,091,050 A | 7/2000 | Carr | |
| 6,331,074 B1 | 12/2001 | Kimura | |
| 6,460,966 B1 | 10/2002 | Hellekson et al. | |
| 6,705,152 B2 | 3/2004 | Routkevitch et al. | |
| 6,896,780 B2 * | 5/2005 | Yang et al. .................. | 204/408 |
| 7,049,556 B2 | 5/2006 | Aoki et al. | |
| 7,119,656 B2 | 10/2006 | Landsberger et al. | |
| 7,329,361 B2 * | 2/2008 | Guha et al. ............... | 216/2 |
| 7,525,071 B2 | 4/2009 | Goto et al. | |
| 7,533,564 B2 | 5/2009 | Pan et al. | |
| 7,807,483 B2 | 10/2010 | Yamazaki et al. | |

(Continued)

FOREIGN PATENT DOCUMENTS

| JP | 07-022315 | | 1/1995 |
|---|---|---|---|
| JP | 2002124466 | * | 4/2002 |

(Continued)

OTHER PUBLICATIONS

European Search Report, dated Sep. 16, 2011, for Application 08157114.3-1242/2066147.

(Continued)

*Primary Examiner* — Julio J Maldonado
*Assistant Examiner* — Mohammad Choudhry
(74) *Attorney, Agent, or Firm* — Harness, Dickey & Pierce, P.L.C.

(57) ABSTRACT

Nano-sized materials and/or polysilicon are formed using heat generated from a micro-heater, the micro-heater may include a substrate, a heating element unit formed on the substrate, and a support structure formed between the substrate and the heating element unit. Two or more of the heating element units may be connected in series.

20 Claims, 16 Drawing Sheets

U.S. PATENT DOCUMENTS

| | | | |
|---|---|---|---|
| 7,999,211 B2 | 8/2011 | Ruiz et al. | |
| 2004/0178879 A1 | 9/2004 | Mitra et al. | |
| 2006/0141135 A1 | 6/2006 | Wang et al. | |
| 2007/0052024 A1* | 3/2007 | Lee et al. | 257/347 |
| 2009/0139974 A1 | 6/2009 | Choi et al. | |
| 2009/0223557 A1 | 9/2009 | Park et al. | |
| 2009/0250112 A1 | 10/2009 | Choi et al. | |
| 2010/0187662 A1 | 7/2010 | Choi et al. | |
| 2010/0193505 A1 | 8/2010 | Peck | |
| 2012/0132643 A1 | 5/2012 | Choi et al. | |

FOREIGN PATENT DOCUMENTS

| | | |
|---|---|---|
| JP | 2004-087143 | 3/2004 |
| JP | 2004-269968 | 9/2004 |
| JP | 2005-150061 | 6/2005 |
| JP | 2006-047276 | 2/2006 |
| JP | 2006-286372 | 10/2006 |
| JP | 2010-278142 | 12/2010 |
| KR | 10-2002-0090428 | 12/2002 |
| KR | 20-0358225 | 7/2004 |
| KR | 10-2004-0103726 | 12/2004 |
| KR | 10-2006-0062139 | 6/2006 |
| KR | 10-2006-0110201 | 10/2006 |
| KR | 10-2007-0009804 | 1/2007 |
| KR | 10-2009-0066644 | 6/2009 |

OTHER PUBLICATIONS

S. Dittmer et al., *Low Ambient Temperature CVD Growth of Carbon Nanotubes.*, 243-246 (2006).
Ongi Englander et al., *Local Synthesis of Silicon Nanowires and Carbon Nanotubes on Microbridges.*, 4797-4799, (2003).
U.S. Appl. No. 12/149,884, filed May 9, 2008.
U.S. Appl. No. 12/149,947, filed May 9, 2008.
U.S. Appl. No. 12/289,440, filed Oct. 28, 2008.
U.S. Appl. No. 12/289,439, filed Oct. 28, 2008.
US Office Action dated Mar. 16, 2012 issued in co-pending U.S. Appl. No. 12/289,439.
US Office Action dated Aug. 30, 2012 issued in co-pending U.S. Appl. No. 12/149,884.
US Office Action dated Jul. 16, 2012 issued in co-pending U.S. Appl. No. 12/289,440.
US Office Action dated Feb. 11, 2013 issued in co-pending U.S. Appl. No. 12/149,884.

* cited by examiner

ମETHODS FOR FORMING MATERIALS
USING MICRO-HEATERS AND ELECTRONIC
DEVICES INCLUDING SUCH MATERIALS

PRIORITY STATEMENT

This application claims priority under 35 U.S.C. §119 to Korean Patent Application No. 10-2007-0071355, filed on Jul. 16, 2007, in the Korean Intellectual Property Office, the entire contents of which are incorporated herein by reference.

BACKGROUND

1. Field

Example embodiments relate to methods for forming nano-sized materials and polysilicon using micro-heaters and electronic devices including the nano-sized materials and/or the polysilicon prepared by such methods.

2. Description of the Related Art

Conventional methods of forming nano-sized materials and polysilicon include excimer laser annealing (ELA), rapid thermal annealing (RTA), and metal-induced lateral crystallization (MILC), etc. Meanwhile, a micro-heater locally generates high temperature heat on a substrate when electric power is applied to the micro-heater.

SUMMARY

Example embodiments provide methods for forming a material, including nano-sized materials and polysilicon, a method may include, applying energy to a micro-heater to heat the micro-heater and forming the material through the heating of the micro-heater on the micro-heater. The micro-heater may have a configuration that allows two or more micro-heaters to be repeatedly connected in series. The micro-heater may include a substrate, at least one heating element unit on the substrate, and a support structure between at least a portion of the substrate and the at least one heating element unit. The heating element unit may have a configuration that allows two or more heating element units to be repeatedly connected in series. Example embodiments also include connecting two or more micro-heaters in series to form a micro-heater array. Example embodiments further provide forming a material catalyst layer on the heating element unit. Other example embodiments provide a heat absorption layer on the substrate and forming the material catalyst layer on the heat absorption layer. Example embodiments also provide that the material may be selected from carbon nanotubes, gallium nitride nano-wires, zinc oxide nano-wires, and polysilicon. Example embodiments also provide electronic devices including the nano-sized materials and/or the polysilicon formed as described above.

BRIEF DESCRIPTION OF THE DRAWINGS

Example embodiments will be more clearly understood from the following detailed description taken in conjunction with the accompanying drawings. FIGS. 1-11 represent non-limiting, example embodiments as described herein.

FIG. 1b is a plain view of the micro-heater shown in FIG. 1a;

FIG. 4 is an I-V graph showing each light emitting point depending on widths (W3) of a contact region of the micro-heaters used in example embodiments;

FIG. 8 is a schematic view showing a polysilicon transistor using a micro-heater array according to example embodiments;

FIG. 11 is an optical microscope photograph showing transformed polysilicon using a micro-heater array according to example embodiments.

DETAILED DESCRIPTION OF EXAMPLE EMBODIMENTS

Figure 1A:
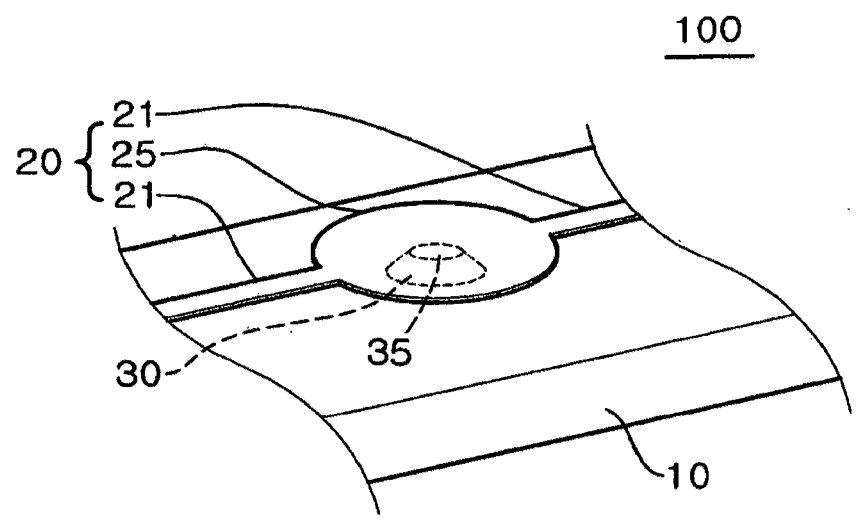
FIG. 1a is a perspective view of a micro-heater used in example embodiments.

Various example embodiments will now be described more fully with reference to the accompanying drawings in which some example embodiments are illustrated. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, e.g. "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" may encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g. those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the example embodiments are not limited to example embodiments described.

Example embodiments will now be described more fully with reference to the accompanying drawings, in which exemplary embodiments of the invention are shown. The example embodiments may, however, be embodied in many different forms and should not be construed as being limited to the embodiments set forth herein. Rather, these embodiments are provided so that this disclosure will be thorough and complete, and will fully convey the scope of the invention to one of ordinary skill in the art. In the drawings, the sizes of constitutional elements may be exaggerated for convenience of illustration.

According to example embodiments, micro-heaters may be used for forming nano-sized materials and/or polysilicon due in part to the micro-heater locally generating high temperatures. The nano-sized material may include, e.g., nanowires such as GaN (gallium nitride), ZnO (zinc oxide), and the like or carbon nanotubes (CNT).

At least two micro-heaters may form a micro-heater array. These micro-heater arrays include two or more of the micro-heaters connected in series. In a micro-heater or a micro-heater array, the power consumed in driving the micro-heater(s) may decrease. Therefore, micro-heaters are suitable for forming nano-sized materials and/or polysilicon.

When at least two micro-heaters are connected in series to form micro-heater arrays, the micro-heater arrays may be further connected in parallel and/or in series. However, if two micro-heaters are connected in parallel without being first connected in series to form a micro-heater array, a current value may be non-uniform and power consumption may increase as the power is divided in the micro-heater array.

The power consumed by driving a micro-heater or a micro-heater array may decrease by decreasing a heat transfer area of a region in which heat transfer occurs between the heating element unit and a support structure that supports the heating element unit. However, this area may only be decreased to a point where the support structure adequately supports the heating element unit. Therefore, by decreasing the area of this region, the power consumed may also be decreased.

Figure 1B:
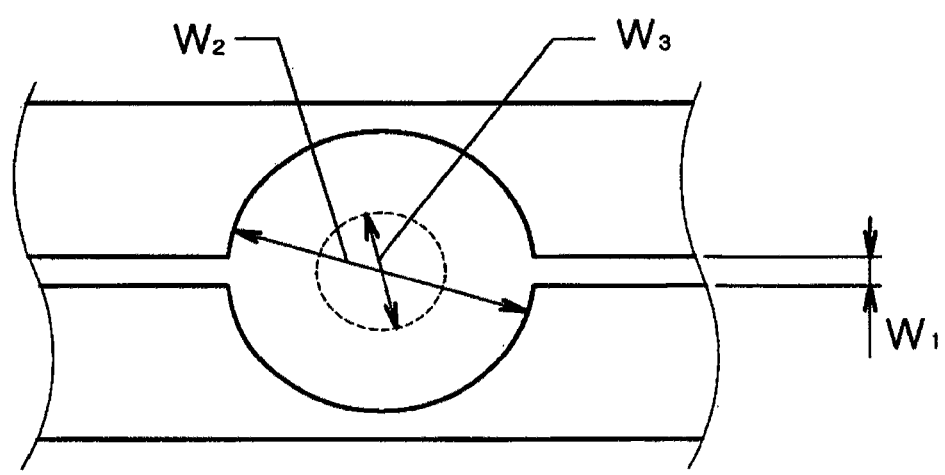

FIG. 1a shows a perspective view of a micro-heater used in example embodiments, and FIG. 1b shows a plain view of the micro-heater shown in FIG. 1a. Referring to FIG. 1a, a micro-heater 100 comprises a substrate 10, a heating element unit 20, and a support structure 30 which supports the heating element unit 20 between the heating element unit 20 and the substrate 10.

The heating element unit 20 may have a shape and/or structure that allows two or more of the heating element units to be repeatedly connected in series. Referring to FIG. 1a heating element unit 20 may have a symmetrical shape and/or structure including second region 25, which may be different from first regions 21 and may be positioned between first regions 21.

Figure 2A:
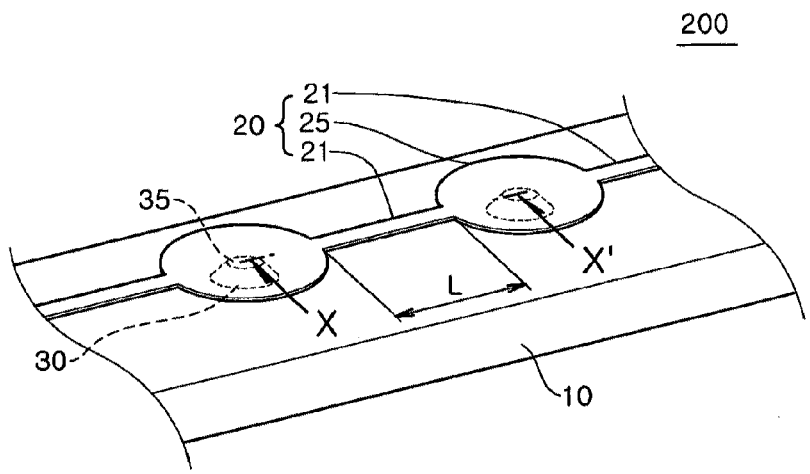
FIG. 2a is a perspective view of a micro-heater array used in example embodiments, wherein two micro-heaters are connected in series.
Figure 2B:
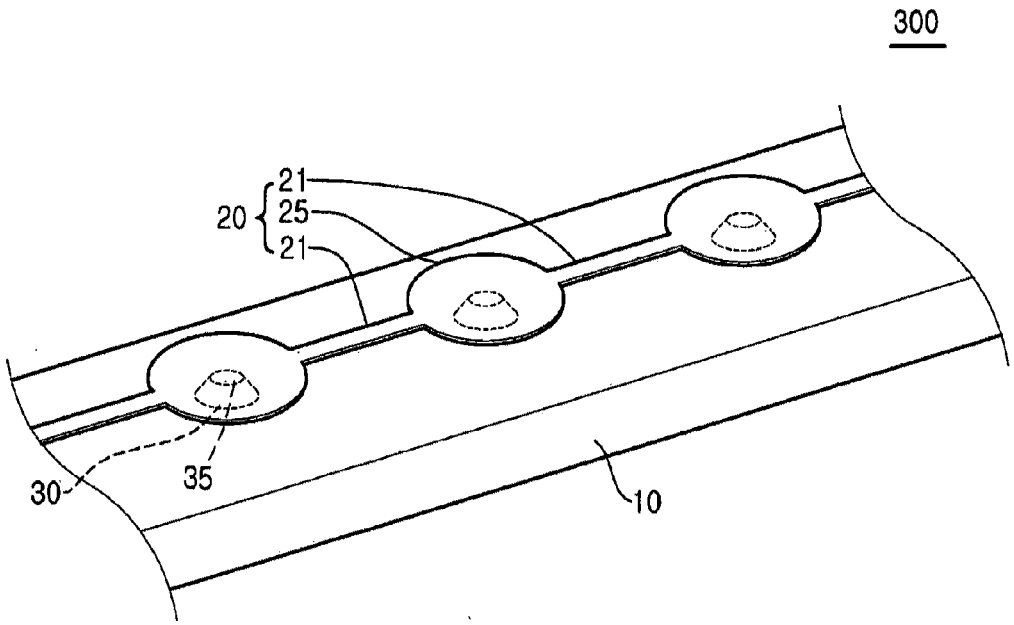
FIG. 2b is a perspective view of a micro-heater array used in example embodiments, wherein three micro-heaters are connected in series.

First region 21 may have a bridge shape, and connect to other first regions 21 of other heating element units 20. Second region 25 may have a circular shape, which may be supported by support structure 30. FIGS. 2a and 2b show example embodiments where heating element units 20 are repeatedly connected in series, thereby repeatedly connecting micro-heaters 100 in series as well.

Heating element unit 20 may be made of e.g. molybdenum, tungsten, silicon carbide and the like, and may emit light, in the visible and/or infrared spectrums. Heating element unit 20 may also generate heat when power is applied thereto.

Support structure 30 supports the heating element unit 20 at a lower part of the second region 25 of the heating element unit 20 at a contact region 35. As the area of contact region 35 decreases, the heat transfer between the support structure 30 and the heating element unit 20 decreases, causing a decrease in consumed driving power of the heating element unit 20.

Ideally the contact region 35 area would be equal to zero; however, when the area of the contact region 35 is decreased beyond a critical point, support structure 30 of the heating element unit 20 becomes structurally unstable. Accordingly, the area of the contact region 35 should be adjusted to be as small an area as needed or relatively more so support of the heating element unit 20 is maintained.

FIG. 1b, shows a width (W1) of the first region 21, a width (W2) of the second region 25 and a width (W3) of the contact region 35. In FIGS. 1a and 1b, the second region 25 and the contact region 35 have circular shapes respectively. However, the second region 25 and/or the contact region 35 may have rectangular shape or may have any of several other possible shapes, in part depending on the etching method used. The widths referred to above refer to a horizontal length of an identified shape, for example, in the circular shape, the width would be equal to the diameter.

Regarding the widths of the respective regions, the width (W2) of the second region 25 may be more than the width (W1) of the first region 21 in order to easily etch the support structure 30, and the contact region 35. In addition, the width (W1) of the first region 21 may be less than the width (W2) of the second region 25 in order that the light emitted and heat generated from the first region 21 is more than the second region 25. However, the location of the light emitting regions and heat generation regions may be adjusted as required.

As described above, the first regions 21 and second region 25 of the heating element unit 20 may be separated, e.g. light emitting and heat generation in the first regions 21 may be comparatively higher than light emitting and heat generation in the second region 25 supported by the support structure 35. The area in which the heat transfer occurs in the second region 25 should be as small as possible. As a result, power waste may be decreased and the applied power may be more efficiently used for heating the first regions 21.

In addition, the width (W3) of the contact region 35 may be smaller than the width (W2) of the second region 25. Since the area of the contact region should be as small as possible (to a limit where the support of the heating element unit 20 may be maintained), the area of the contact region 35 may be smaller than that of the second region 25. Therefore, the width (W3) of the contact region 35 also may be less than the width (W2) of the second region 25.

For example, suppose that the width (W2) of the second region 25 is the same as the width (W1) of first regions 21, then there is likely little to no difference in light emitting and heat generation between the parts of the heating element unit 20. Accordingly, the heat transfer area should be as small as possible, taking into consideration maintaining adequate support for the heating element unit. Therefore, the support structure 30 having a small contact region 35 area may be formed to be substantially linear along the longitudinal direction of the center width of the heating element unit 20.

The width (W3) of the contact region 35 may be, e.g. 0.1~100 μm. If the width (W3) of the contact region 35 is greater than 100 μm, the heat transfer area may be too large causing the power reduction effect to decrease. If the width (W3) of the contact region 35 is less than 0.1 μm, supporting the heating element unit 20 may be difficult. An example width (W3) for the contact region 35, which may reduce the power and maintain support of the heating element unit 20 may be 2~3 μm. The width (W2) of the second region 25 may be 0.1~100 μm and the width (W1) of the first regions 21 may range between 0.1~30 μm.

The substrate may be made of glass, plastic, or similar insulating materials instead of silicon. For example, a silicon wafer may absorb the radiant heat (visible and/or infrared) during heating and thus may break. However, glass is insulating and transmits radiant heat, so high temperature heating is possible. Therefore, a glass substrate enables high temperature heating and may therefore be suitable for micro-heaters and micro-heater arrays. In the micro-heaters or the micro-heater arrays, a local heating of 600~2,000° C. may be performed while the temperature of the glass substrate is maintained at 50° C. or less.

FIG. 2a shows a perspective view of a heating element array according to example embodiments, wherein two heating elements are connected in series, and FIG. 2b shows a perspective view of a heating element array according to example embodiments, wherein three heating elements are connected in series.

As shown in FIGS. 2a and 2b, two or more heating elements units 20 are connected to each other, e.g. first regions 21 become bridges between second regions 25 of any two heating element units 20. Referring to FIG. 2a, a length of the bridge L may be 5~150 μm. Further, DC current may be applied to the heating element arrays (200, 300).

As shown in FIGS. 2a and 2b, two or more heating element units 20 may be connected in series to form a heating element array (200, 300), e.g. so power consumption may decrease. The heating element arrays (200, 300) may exhibit a stable shape even after the heating element arrays (200, 300) are heated to 1,500° C. or more. In addition, the micro-heater arrays may be connected in parallel.

Figure 3A:
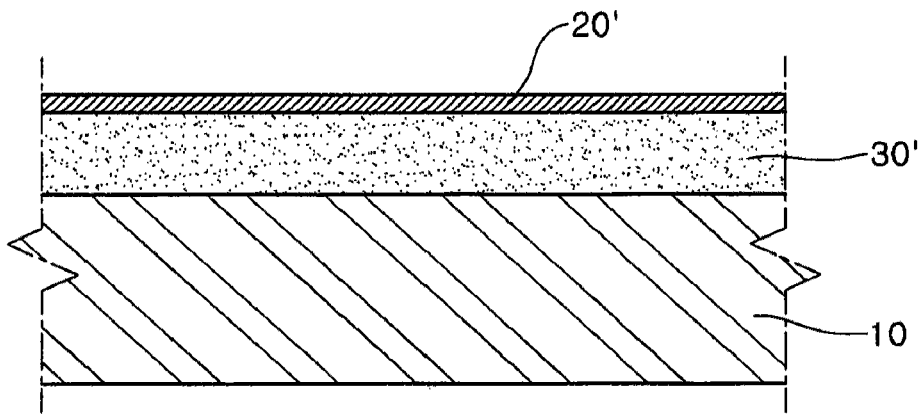
FIGS. 3a to 3d illustrate a method for manufacturing a micro-heater array used in example embodiments with side views (FIGS. 3a, 3c, 3d) and a plain view (FIG. 3b)
Figure 3B:
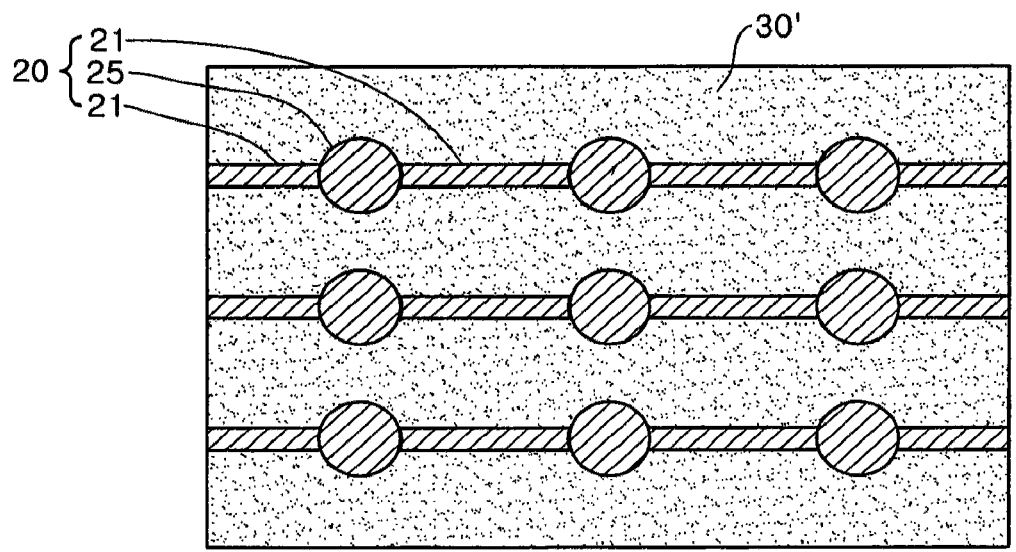

FIGS. 3a to 3d illustrate a method for manufacturing a micro-heater array according to example embodiments with side views (FIGS. 3a, 3c, 3d) and a plain view (FIG. 3b). Referring to FIG. 3a, a heating element layer 20' is formed on a substrate 10 while interposing a sacrificial layer 30', which will be etched to become support structure 30, between the heating element layer 20' and the substrate 10. The heating element layer 20', may include, e.g. Mo, W, Sic and the like and may be e.g. vapor-deposited. The sacrificial layer 30', may include e.g. $SiO_x$ and similar materials, having a low heat transfer coefficient and may be e.g. vapor-deposited.

Figure 3C:
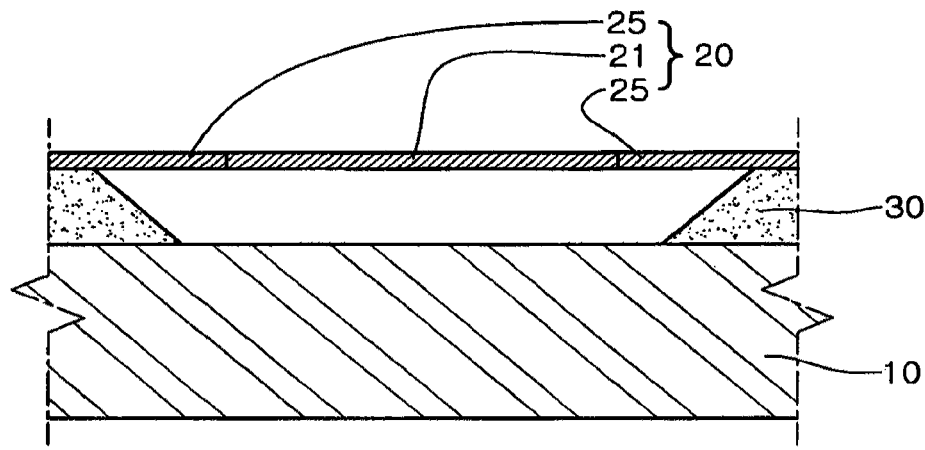
Figure 3D:
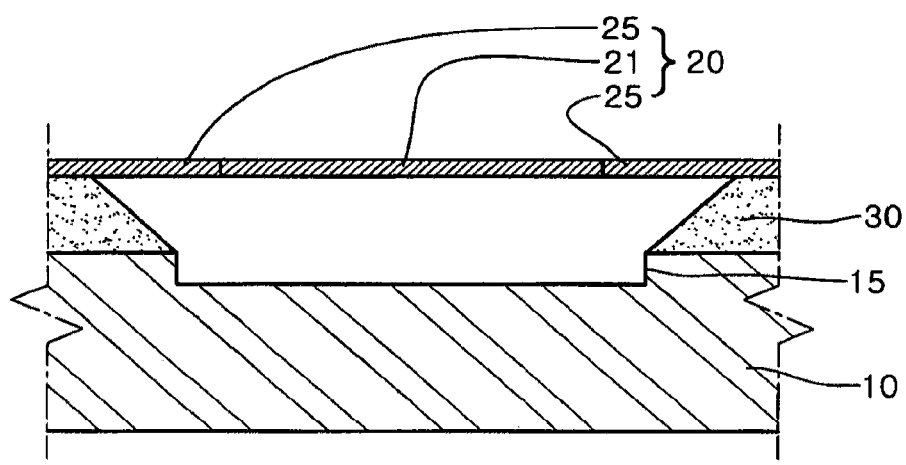

Referring to FIG. 3b, the heating element layer 20' is patterned so that two or more of the heating element units 20 which have first regions 21 and a second region 25 between the first regions 21, are connected in series to form an array. The patterning may be performed by e.g. dry etching, wet etching, etc. Referring to FIG. 3c, the sacrificial layer may be removed by etching thereby forming the support structure 30. The etching may be performed to reduce an area of a contact region 35 between the support structure 30 and the heating element unit 20. Referring to FIG. 3d, the substrate 10 between the support structures 30 may be further etched as shown in area 15.

Figure 4:
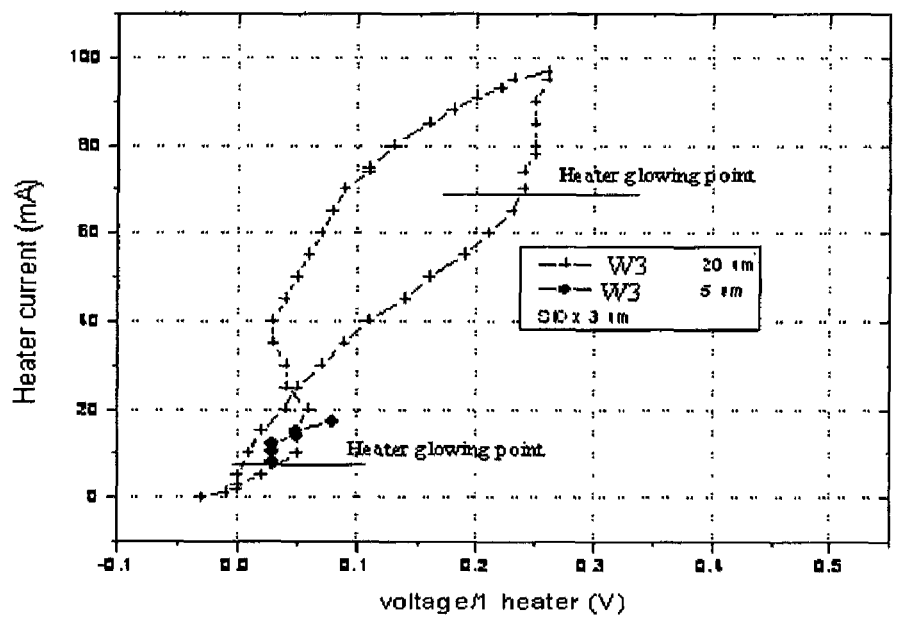

FIG. 4 is an I-V graph showing each light emitting point depending on the widths (W3) of the contact regions 35 of the heating element units 20 according to example embodiments. Referring to FIG. 4, as shown, the light emitting points may be different depending on the widths (W3) of contact regions 35. For example, comparing the power consumption obtained from the heater current multiplied by voltage per heater in each light emitting point, shows that the power consumption where the width (W3) of a contact region 35 is relatively small (5 µm) is less than the power consumption where the width (W3) of a contact region 35 is relatively large (20 µm).

In an example embodiment, a total of 751 heating element units 20 were arranged to form an array. In the array, a length (L) was 30 µm and a width (W1) was 10 µm. Further, a width (W2) was 30 µm and a width (W3) was 3 µm. The entire size of the array was 4.5×1.3 mm. The power consumption was 0.07 W (7 mA×10V).

As described above, the power consumption of a micro-heater or a micro-heater array is low, which allows one to form large arrays. According to example embodiments, nano-sized material and/or polysilicon may be formed using the local heat generated from micro-heaters.

Figure 5A:
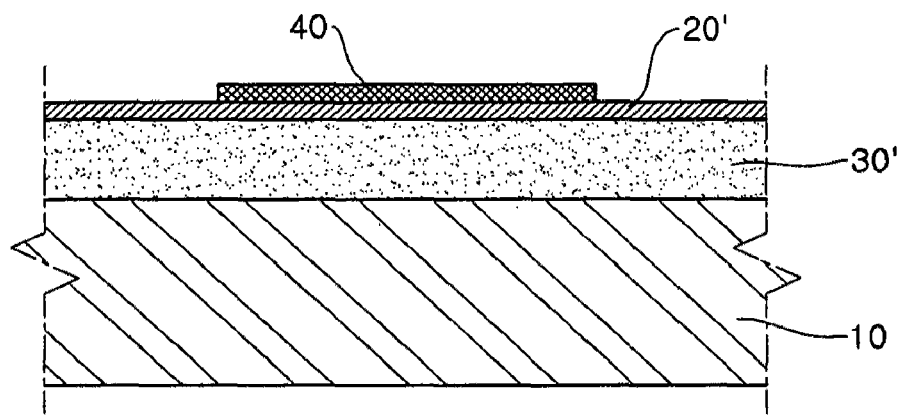
FIGS. 5a to 5c show a method of forming nano-sized materials on a heating element unit of a micro-heater array according to example embodiments, based on the X-X' section (refer to FIG. 2a)
Figure 5B:
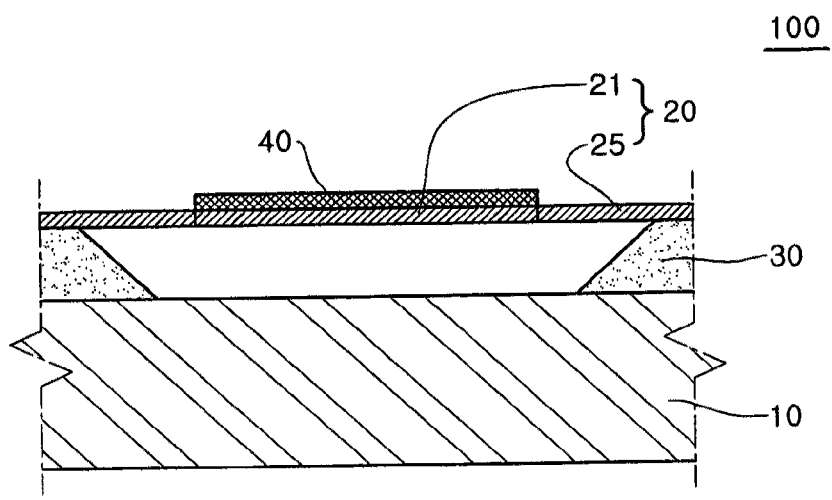
Figure 5C:
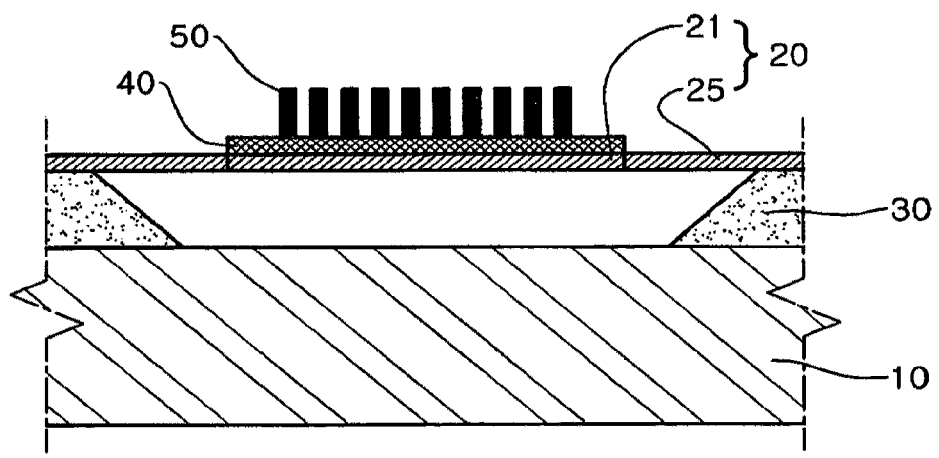

FIGS. 5a to 5c illustrate a process of forming nano-sized materials on a heating element unit 20 of a micro-heater array according to example embodiments, based on the X-X' section of FIG. 2a. As shown in FIG. 5a, a sacrificial layer 30', which will become support structure 30, is formed on a substrate 10. A heating element layer 20' is formed on the sacrificial layer 30'. The heating element layer 20' is patterned so that two or more of the heating element units 20 may be repeatedly connected in series, as described above referring to FIG. 2a. A catalyst layer 40 is further formed for growing nano-sized materials, for example, carbon nanotubes and/or ZnO nano-wires at a desired position on a portion of the heating element layer 20'. However, the catalyst layer 40 may not be necessary for growing some nano-sized materials, e.g. GaN nano-wires.

As described with reference to FIGS. 3a to 3d, as shown in FIG. 5b, the sacrificial layer 30' may be etched to form a support structure 30 to support the heating element unit 20 formed through patterning at a lower part of the heating element unit 20. In order to decrease the heat transfer between the support structure 30 and the heating element unit 20, an area of a contact region 35 between the support structure 30 and the heating element unit 20 may be decreased to an area just needed to support the heating element unit 20.

The formed micro-heater 100 may then be put in a processing chamber where power is applied to the micro-heater 100 (not shown). The chamber may be maintained at room temperature. To grow carbon nanotubes, for example, acetylene ($C_2H_2$) and Argon (Ar) may be introduced into the chamber, to grow GaN nano-wires, for example, gallium chloride and ammonia ($NH_3$) may be introduced into the chamber, and to grow ZnO nano-wires, for example, zinc and oxygen sources may be introduced into the chamber.

The micro-heater 100 to which power is applied generates radiant heat and emits visible and/or infrared light/energy. When the temperature of the micro-heater 100 reaches about 500° C. or more, nano-sized materials 50, for example, carbon nanotubes, ZnO nano-wires, GaN nano-wires and the like may be grown and/or formed, as shown in FIG. 5c.

Figure 6A:
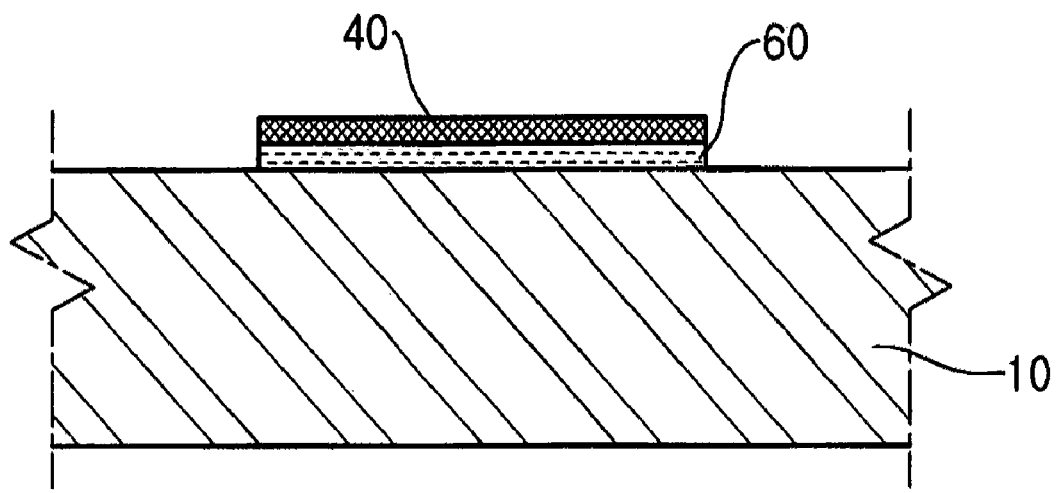
FIGS. 6a to 6e show a method of forming nano-sized materials below a micro-heater unit of a micro-heater array according to example embodiments, based on the X-X' section (refer to FIG. 1a)

FIGS. 6a to 6e illustrate a process of forming nano-sized materials below a heating element layer 20' of a micro-heater array according to example embodiments, based on the X-X' section of FIG. 2a. A heat absorption layer 60 may be formed on substrate 10 and a catalyst layer 40 may be formed on the heat absorption layer 60 as shown in FIG. 6a. As described above with reference to FIG. 5a, the catalyst layer 40 may be used to grow nano-sized materials, for example, carbon nanotubes or ZnO nano-wires. However, the catalyst layer 40 may not be necessary for growing some nano-sized materials, e.g. GaN nano-wires.

Figure 6B:
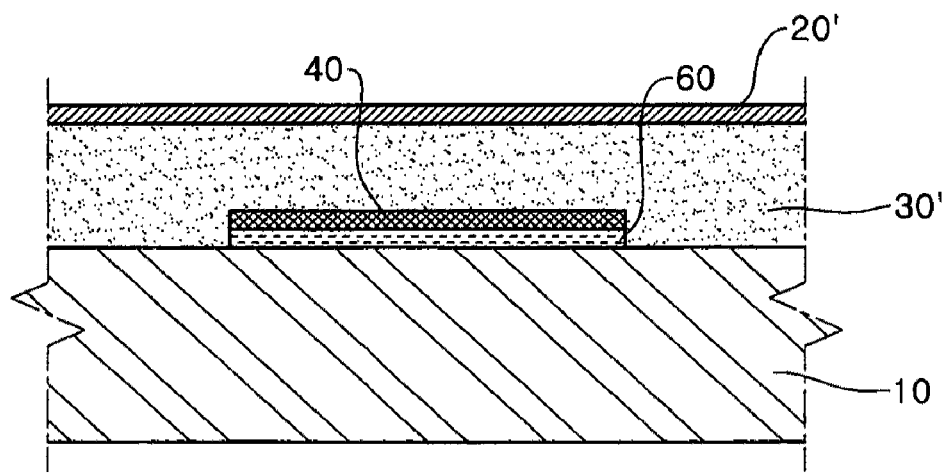

As shown in FIG. 6b, sacrificial layer 30' may then be vapor-deposited so that the sacrificial layer 30' covers the heat absorption layer 60, the catalyst layer 40 and the remaining part of the substrate 10. The heating element layer 20' may then be vapor-deposited.

Figure 6C:
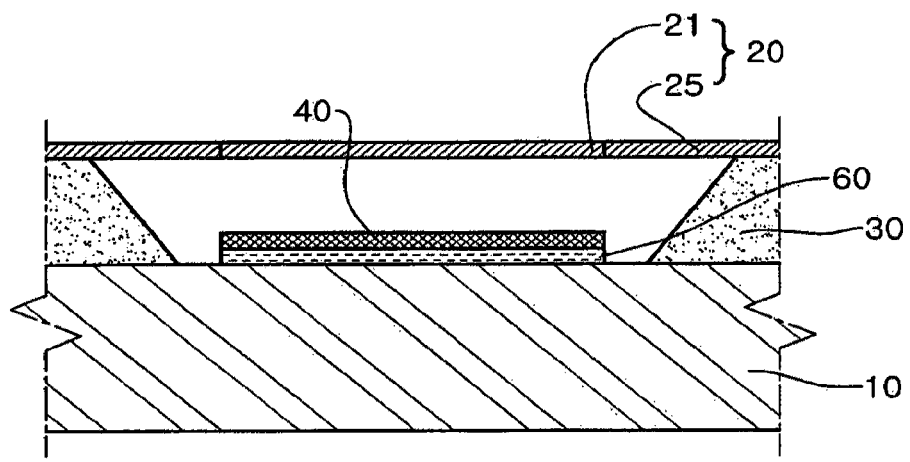
Figure 6D:
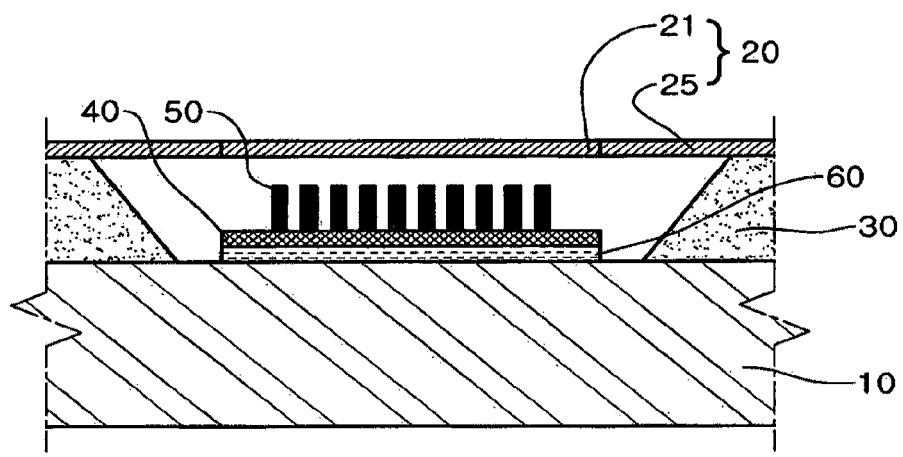
Figure 6E:
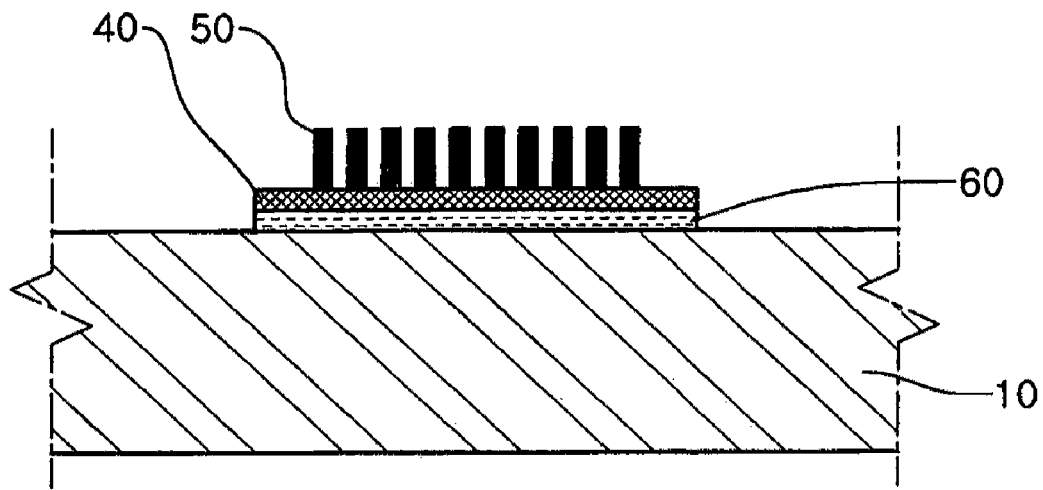

FIG. 6c shows heating element layer 20' having been patterned and sacrificial layer 30' having been etched as described above with reference to FIG. 5b. The micro-heater 100 may then be placed in a processing chamber and power applied to the micro-heater 100. The heating element unit 20 of the micro-heater 100 generates heat to form and/or grow nano-sized materials 50 as described above referring to FIG. 5c and shown in FIG. 6d. FIG. 6e shows a structure of the micro-heater array where the heating element unit 20 and the support structure 30 have been removed from micro-heater 100 to illustrate the formed nano-sized material at a desired position.

Figure 7A:
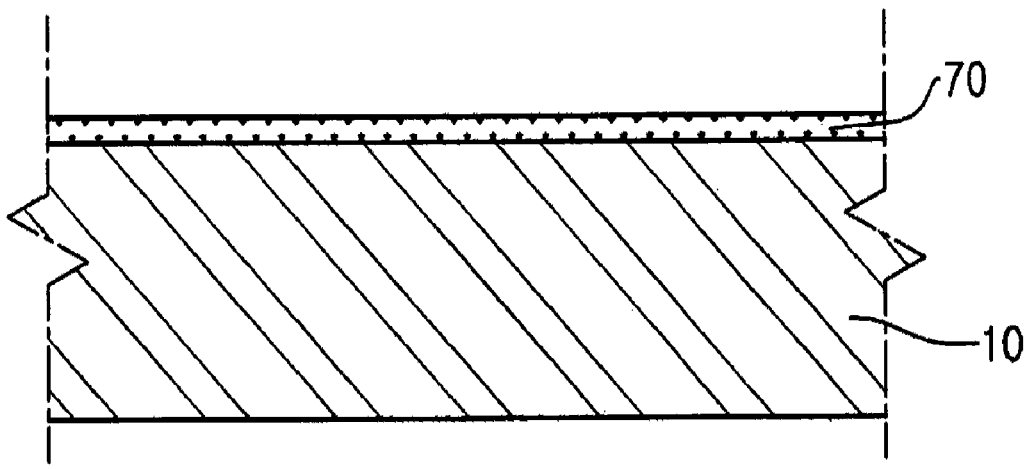
FIGS. 7a to 7e show a method of forming polysilicon in a micro-heater array according to example embodiments, based on the X-X' section (refer to FIG. 2a)
Figure 7B:
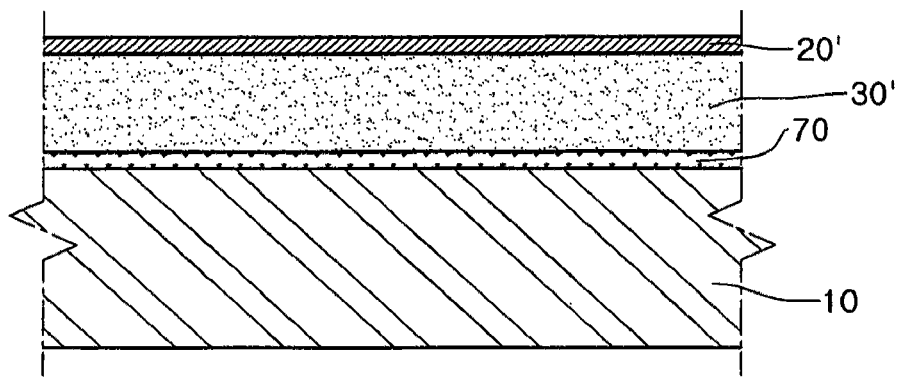
Figure 7C:
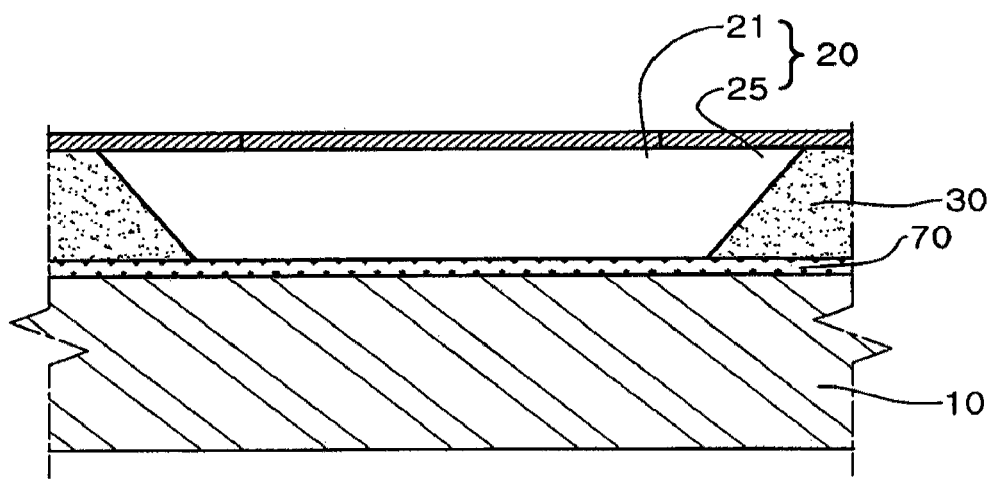
Figure 7D:
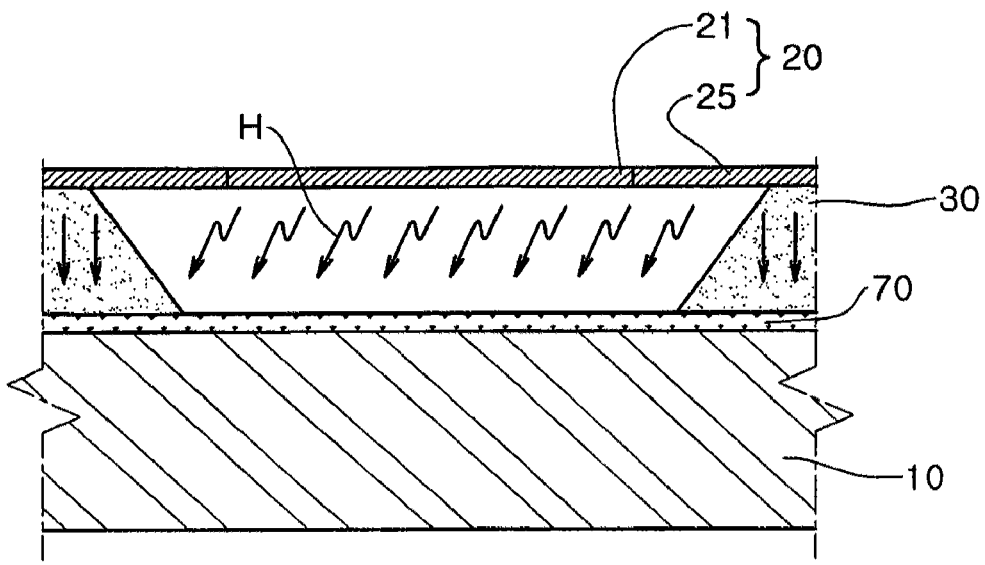

FIGS. 7a to 7e show a process of forming polysilicon using a micro-heater array according to example embodiments, based on the X-X' section of FIG. 2a. As shown in FIG. 7a, an amorphous silicon layer 70 may be formed on a substrate 10. As shown in FIG. 7b a sacrificial layer 30', which will be etched to form support structure 30, may be formed on the amorphous silicon layer 70 and a heating element layer 20' may be formed on the sacrificial layer 30'. The thickness of the sacrificial layer 30' is about 1 µm. In FIG. 7c, the heating element layer 20' may be patterned and the sacrificial layer 30' may be etched in a similar manner as described with reference to FIG. 5b.

Figure 7E:
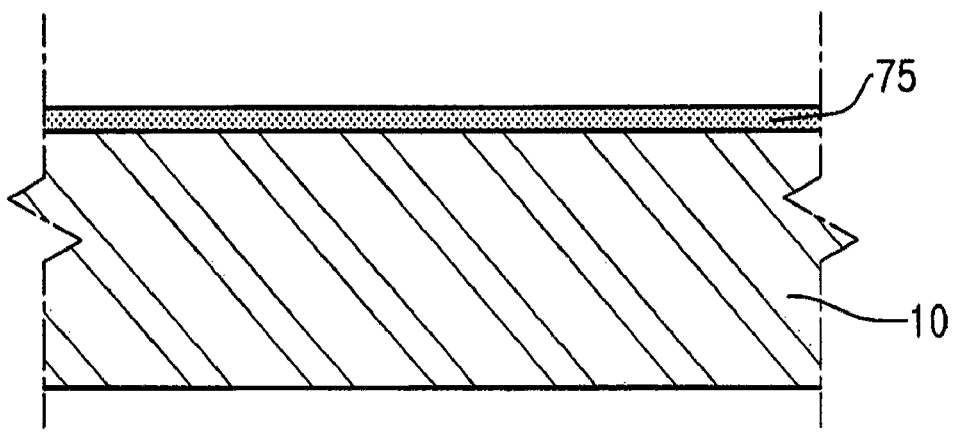

The micro-heater 100 may then be put in a process chamber (not shown) and power applied to the micro-heater 100. The heating element unit 20 may then generate heat H as described above with reference to FIG. 5c and shown in FIG. 7d. The heat H can be transferred from the heating element unit 20 to the amorphous silicon 70 by conduction through the supporter 30 as well as by radiation. Due to the heat H, the amorphous silicon 70 including the amorphous silicon under the supporter 30 can be transformed into polysilicon 75. FIG. 7e shows a structure of the micro-heater array, where the heating element unit 20 and the support structure 30 have been removed from micro-heater 100. One may use such a structure to manufacture e.g., a thin film transistor (TFT) or a solar cell.

Figure 8:
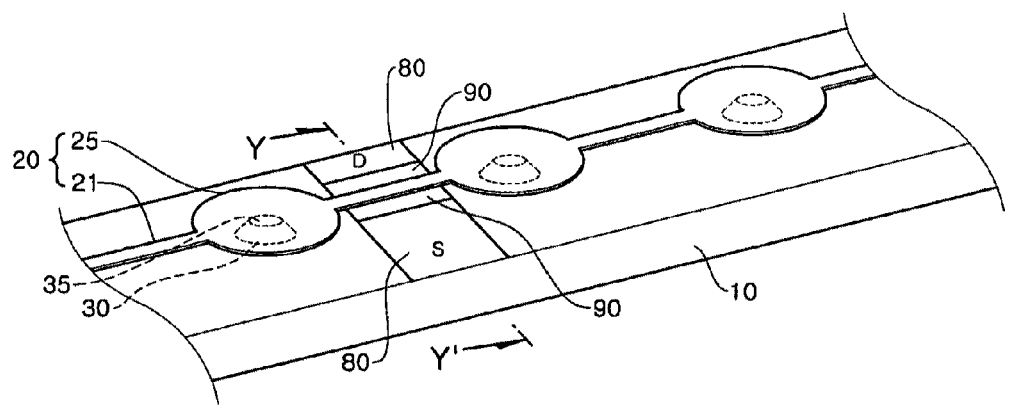

FIG. 8 is a schematic view showing a polysilicon transistor using a micro-heater array according to example embodiments. Referring to FIG. 8, drain and source electrode layers 80 are formed on the substrate 10 and at a lower part of the heating element unit 20 intersecting the heating element unit 20 at right angles. An amorphous silicon layer 90 is formed on the drain and source electrode layers 80 and at a lower part of a center of the heating element unit 20.

FIGS. 9a to 9e show a process of manufacturing a polysilicon transistor using a micro-heater array according to example embodiments, based on the Y-Y' section of FIG. 8.

Figure 9A:
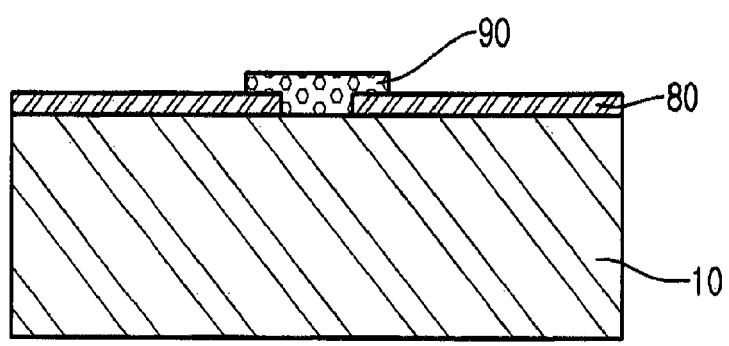
FIGS. 9a to 9e show a process of manufacturing a polysilicon transistor using a micro-heater array according to example embodiments, based on the Y-Y' section (refer to FIG. 8)

Drain and source electrode layers 80 may be formed on the substrate 10 and then patterned. An amorphous silicon layer 90 may be vapor-deposited and patterned as shown in FIG. 9a. For n-type amorphous silicon, the n-type amorphous silicon may be vapor-deposited after vapor-depositing n+ silicon.

Figure 9B:
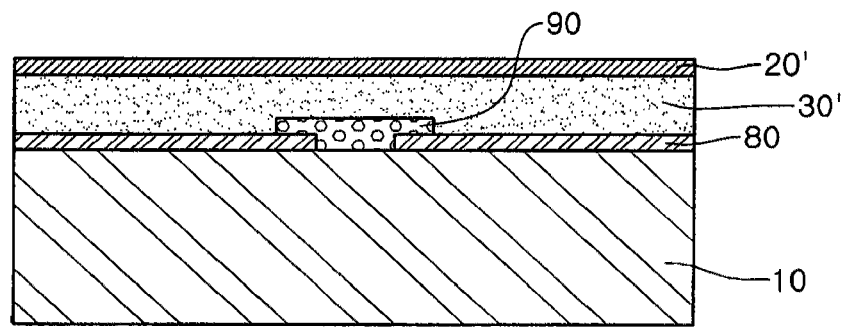
Figure 9C:
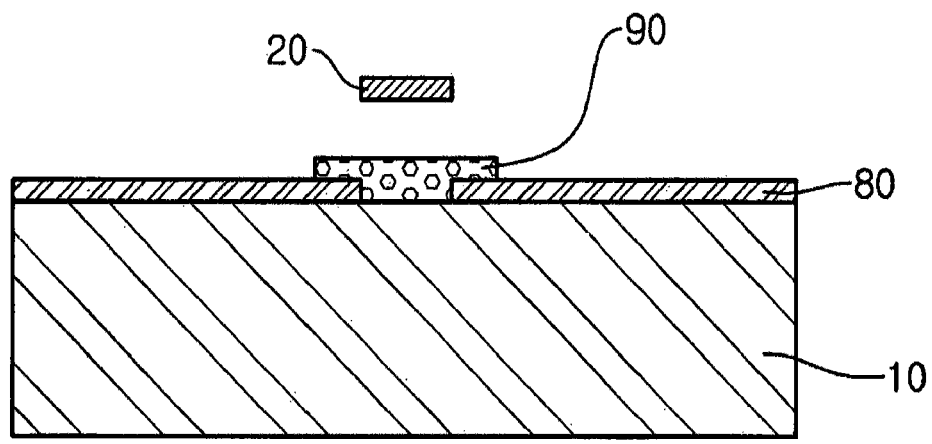
Figure 9D:
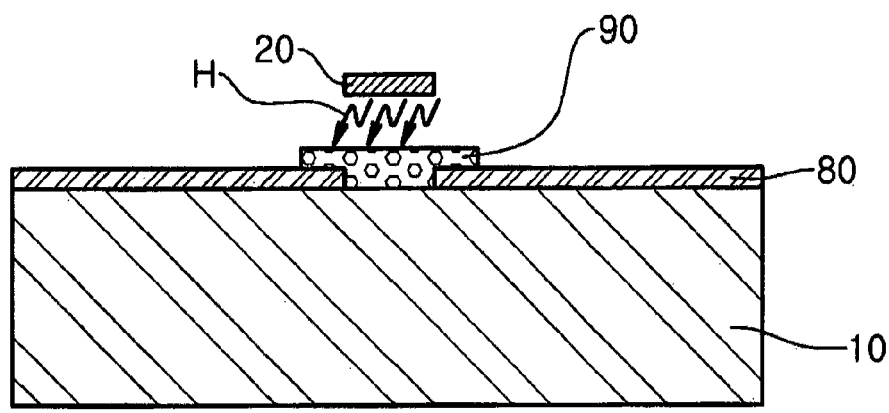
Figure 9E:
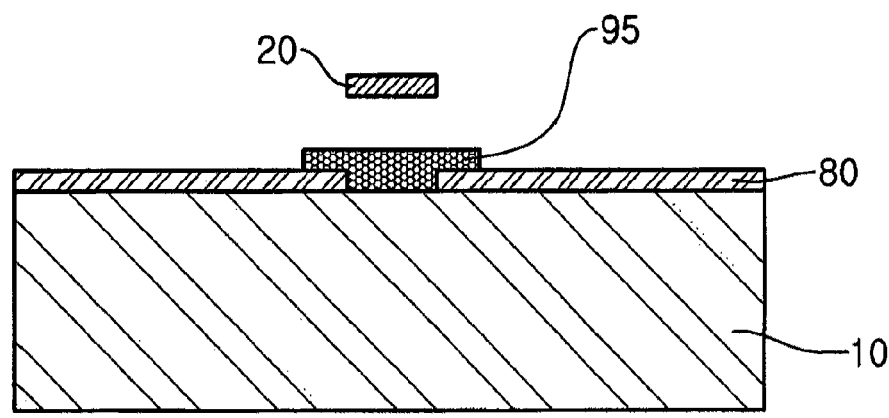

As shown in FIG. 9b, a sacrificial layer 30', which will be etched into support structure 30, may be formed as well as a heating element layer 20'. Then, the heating element layer 20' is patterned and the sacrificial layer 30' may be etched as shown in FIG. 9c. The micro-heater array may then be put in a processing chamber (not shown), and power may be applied to the micro-heater array. As shown in FIG. 9d, the heating element unit 20 generates heat H and the amorphous silicon 90 is transformed into polysilicon 95 as shown in FIG. 9e. When the heater is turned off, an air gap LTPS (low temperature polysilicon) transistor may be formed. Further, when an insulating film is vapor-deposited thereon, a thin film transistor (TFT) may be formed.

Figure 10A:
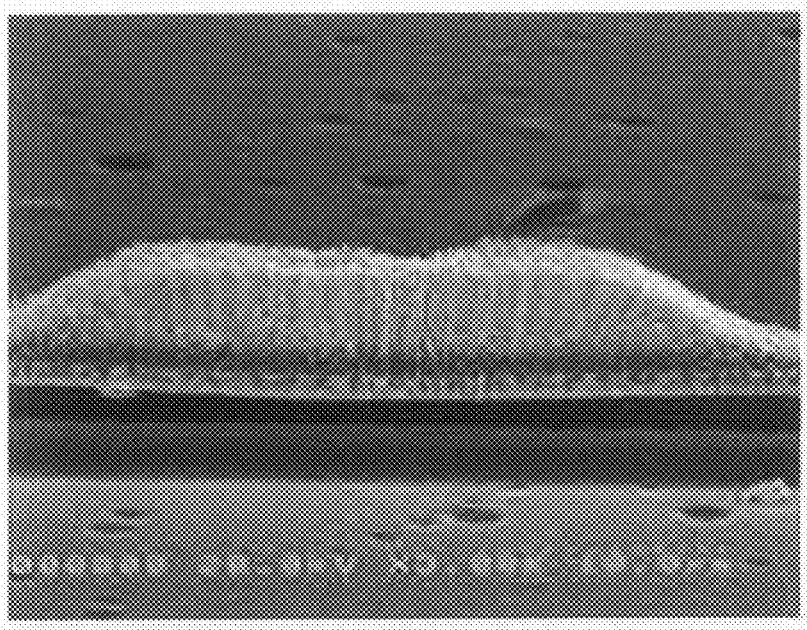
FIGS. 10a to 10c are SEM photographs showing carbon nanotubes formed using a micro-heater array according to example embodiments.
Figure 10B:
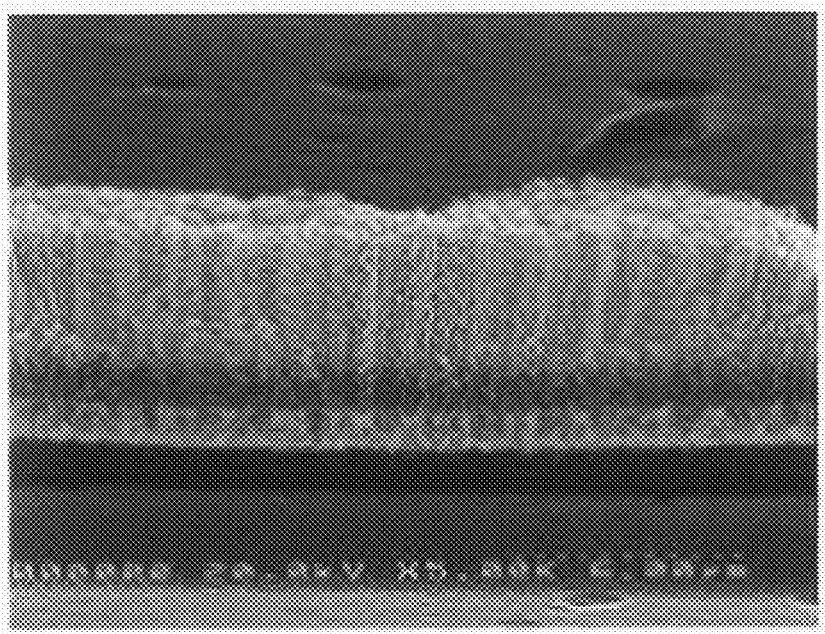
Figure 10C:
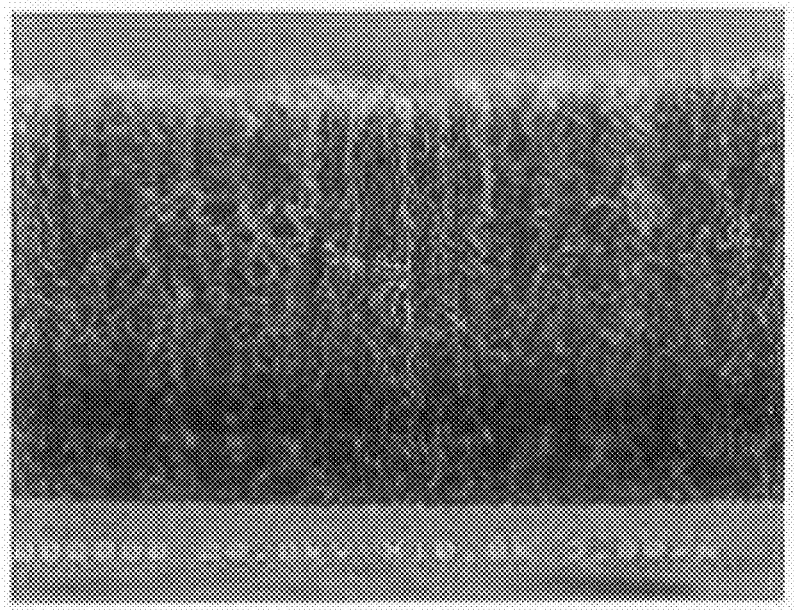

FIGS. 10a to 10c are SEM photographs showing carbon nanotubes formed using a micro-heater array according to example embodiments. The carbon nanotubes grown in FIGS. 10a to 10c were grown at conditions of 200/200 ($C_2H_2$/Ar) sccm and 8 torr for 10 minutes as the micro-heater array was being operated.

Figure 11:
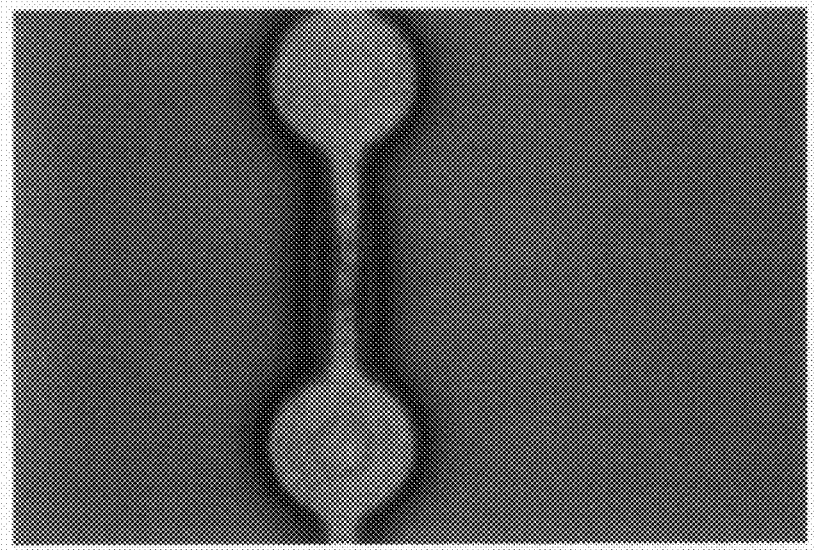

FIG. 11 is an optical microscope photograph showing amorphous silicon changed to polysilicon using a micro-heater array according to example embodiments. In FIG. 11, the distance between the heating element unit and the amorphous silicon was about 1 μm and the micro-heater array was operated for about 1 hour. Referring to FIG. 11, the surroundings of the micro-heater array appear slightly changed indicating that the amorphous silicon was successfully changed into polysilicon.

According to example embodiments, locally formed nano-sized materials or polysilicon may be formed using lower power consumption and having increased area. Further, according to example embodiments, the temperature of the substrate may be maintained around room temperature when forming the nano-sized materials or polysilicon. Therefore, example embodiments may implement nano-sized materials or polysilicon on glass, plastic, or similar substrates. Further, according to example embodiments, GaN LEDs may also be implemented on glass substrates.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method for forming a material comprising:
   applying energy to a micro-heater to heat the micro-heater;
   providing a precursor so as to be in thermal proximity to the micro-heater; and
   forming a material from the precursor with the heat from the micro-heater such that the material is formed directly on the micro-heater,
   wherein the micro-heater includes a substrate, at least one heating element unit on the substrate, a support structure between a portion of the substrate and a portion of the at least one heating element unit,
   wherein the at least one heating element unit has a configuration that allows two or more heating element units to be repeatedly connected in series,
   wherein the at least one heating element unit has at least two first regions and a second region, the second region being located between the first regions, and the first regions having a higher light emission and heat generation than the second region, and
   wherein the support structure is located below a portion of the second region but not below the first regions.

2. The method of claim 1, wherein the micro-heater has a configuration that allows two or more micro-heaters to be repeatedly connected in series.

3. The method of claim 1, wherein two or more micro-heaters are connected in series to form a micro-heater array.

4. The method of claim 2, the micro-heater further including a contact region formed between the support structure and the at least one heating element unit.

5. The method of claim 4, wherein the contact region is decreased to a size where the contact region still supports the at least one heating element unit.

6. The method of claim 2, wherein a width of the second region is larger than a width of the at least two first regions.

7. The method of claim 6, the micro-heater further including a contact region formed between the support structure and the at least one heating element unit, wherein an area of the contact region is smaller than an area of the second region.

8. The method of claim 2, wherein the substrate is glass.

9. The method of claim 2, wherein the forming of the material is on the at least one heating element unit.

10. The method of claim 9, further including, forming a material catalyst layer on the at least one heating element unit.

11. The method of claim 2, further including,
    providing a heat absorption layer on the substrate of the micro-heater; and
    forming the material catalyst layer on the heat absorption layer.

12. The method of claim 2, wherein the material is one or more of the materials selected from the group consisting of carbon nanotubes, gallium nitride nano-wires, zinc oxide nano-wires, and polysilicon.

13. The method of claim 12, wherein the material is carbon nanotubes or zinc oxide nano-wires, and the material is formed from the material catalyst layer.

14. The method of claim 12, wherein the material is gallium nitride nano-wires, and the material is formed on a part of the heating element unit.

15. The method of claim 12, wherein the material is polysilicon.

16. The method of claim 15, further including,
    providing amorphous silicon as the precursor on the at least one heating element unit, wherein the amorphous silicon is formed into the polysilicon.

17. An electronic device comprising:
    the material prepared by the method of claim 1; and
    a micro-heater array, wherein the micro-heater includes two or more micro-heaters connected in series to form the micro-heater array,
    wherein the micro-heater includes the substrate, the at least one heating element unit on the substrate, the support structure between the portion of the substrate and the portion of the at least one heating element unit, wherein the at least one heating element unit has the configuration that allows the two or more heating element units to be repeatedly connected in series, wherein the at least one heating element unit has the at least two first regions and the second region, the second region being located between the first regions, and the first regions having the higher light emission and heat generation than the second region, and wherein the support structure is located below the portion of the second region but not below the first regions.

18. The electronic device of claim 17, wherein the material is one or more of the materials selected from the group consisting of carbon nanotubes, gallium nitride nano-wires, zinc oxide nano-wires, and polysilicon.

19. The electronic device of 18, further comprising:
a drain electrode; and
a source electrode;
wherein the drain electrode and the source electrode intersect on a portion of the substrate at right angles and polysilicon is formed on the drain and source electrodes to form a transistor.

20. The electronic device according to claim 19, wherein the transistor is a thin film transistor having an insulating film deposited on the transistor.

* * * * *